United States Patent
Sengupta et al.

(10) Patent No.: US 11,398,826 B1
(45) Date of Patent: Jul. 26, 2022

(54) HALF RATE BANG-BANG PHASE DETECTOR

(71) Applicant: HCL Technologies Limited, New Delhi (IN)

(72) Inventors: Debraj Sengupta, Kolkata (IN); Chandrima Chaudhuri, Kharagpur (IN); Mouvik Bag, Kharagpur (IN)

(73) Assignee: HCL Technologies Limited, Noida (IN)

( * ) Notice: Subject to any disclaimer, the term of this patent is extended or adjusted under 35 U.S.C. 154(b) by 0 days.

(21) Appl. No.: 17/478,934

(22) Filed: Sep. 19, 2021

(51) Int. Cl.
*H03L 7/091* (2006.01)
*H03L 7/08* (2006.01)
*H03K 19/21* (2006.01)
*H03L 7/099* (2006.01)
*H04L 7/00* (2006.01)

(52) U.S. Cl.
CPC ............ *H03L 7/091* (2013.01); *H03K 19/21* (2013.01); *H03L 7/0807* (2013.01); *H03L 7/099* (2013.01); *H04L 7/0079* (2013.01)

(58) Field of Classification Search
CPC ....... H03L 7/091; H03L 7/0807; H03L 7/099; H03K 19/21
See application file for complete search history.

(56) References Cited

U.S. PATENT DOCUMENTS

| | | | | |
|---|---|---|---|---|
| 4,773,085 A * | 9/1988 | Cordell | ................. | H03L 7/0891 331/25 |
| 7,482,841 B1 * | 1/2009 | Nguyen | ............... | H03D 13/004 327/12 |
| 7,697,603 B1 * | 4/2010 | Wang | ................ | H04L 25/03057 381/103 |
| 7,795,926 B2 | 9/2010 | Tseng et al. | | |
| 9,112,655 B1 * | 8/2015 | Hoang | ................. | H03L 7/0807 |
| 9,813,069 B1 * | 11/2017 | Chattopadhyay | ....... | H03L 7/099 |
| 2007/0001713 A1 | 1/2007 | Lin | | |

(Continued)

FOREIGN PATENT DOCUMENTS

| | | | | |
|---|---|---|---|---|
| CN | 102801414 A | | 11/2012 | |
| CN | 104539285 A | * | 4/2015 | ............... H03L 7/00 |

(Continued)

OTHER PUBLICATIONS

"Huihua Liu," Title: "A novel digital phase interpolation control for clock and data recovery circuit".

*Primary Examiner* — Adam D Houston
(74) *Attorney, Agent, or Firm* — Kendal Sheets

(57) ABSTRACT

A half rate bang—bang phase detector for high-speed Analog Clock and Data Recovery (CDR) is disclosed. In some embodiments, the half rate bang—bang phase detector includes a first set of flip flops. Each of the first set of flip flops is configured to receive an input data sampled at each of a four phases of a Voltage Controlled Oscillator (VCO) clock. The half rate bang—bang phase detector includes a first set of logic gates configured to generate a set of four exclusive—OR (XOR) outputs. The half rate bang—bang phase detector includes a second set of flip flops configured to generate a set of clean XOR outputs. The half rate bang—bang phase detector includes a second set of logic gates configured to generate a set of final outputs based on the set of clean XOR outputs.

18 Claims, 4 Drawing Sheets

(56) References Cited

U.S. PATENT DOCUMENTS

| | | | |
|---|---|---|---|
| 2008/0080649 A1* | 4/2008 | Gibbons | H03L 7/0812 375/373 |
| 2009/0110136 A1* | 4/2009 | Badalone | H03D 13/004 375/376 |
| 2017/0093558 A1* | 3/2017 | Ramezani | H04L 7/0029 |
| 2018/0083809 A1* | 3/2018 | Tajalli | H03L 7/0995 |

FOREIGN PATENT DOCUMENTS

| | | | | |
|---|---|---|---|---|
| CN | 106209070 A | * | 12/2016 | |
| CN | 106067811 B | * | 5/2019 | ........... H03L 7/0807 |
| IN | 201641027564 A | | 2/2018 | |
| IN | 202111034171 A | * | 8/2021 | |

* cited by examiner

US 11,398,826 B1

HALF RATE BANG-BANG PHASE DETECTOR

TECHNICAL FIELD

Generally, the invention relates to a phase detector. More specifically, the invention relates to a half rate bang—bang phase detector for high-speed Analog Clock and Data Recovery (CDR).

BACKGROUND

In data communications applications such as optical fiber backbones, chip-to-chip interconnections, and wireless communications, the Clock and Data Recovery (CDR) circuit is one of the most significant and widely used components. The CDR circuits usually have two locking mechanisms, one is for frequency, while another one is for phase. Additionally, a typical analog CDR consists of Phase Detector (PD), Charge Pump (CP), Loop Filter (LPF), and Voltage Controlled Oscillator (VCO). The Phase detector circuit of the analog CDR generates an error signal based on phase difference between an input data received from analog front-end and clock coming from VCO. The combined circuitry of Charge Pump and Low Pass Filter then converts phase error (i.e., the phase difference) to error voltage in order to adjust the VCO frequency. The VCO frequency is adjusted to maintain the phase alignment between the input data and clock coming from VCO.

In order to meet demands of high speed SERDES (i.e., Serializer and De-serializer) in comparatively higher technology nodes, half rate CDR is preferred. Moreover, the haft rate CDR is preferred due to its relaxed timing constraints in the phase detector. Currently, rising expansion of data transportation necessitates faster communication networks, therefore the design of CDR circuits gets increasingly difficult as the input data rate increases. Hence, some unique structures and approaches are required, to achieve improved jitter performance, reduced power dissipation, and simpler CDR integration.

Therefore, there is a need of implementing an efficient and reliable Half-Rate Bang-Bang Phase Detector (BBPD) for high-speed Analog Clock and Data Recovery (CDR) that resembles performance of its full rate counterpart.

SUMMARY OF INVENTION

In one embodiment, a half rate bang—bang phase detector for high-speed Analog Clock and Data Recovery (CDR) is disclosed. The half rate bang—bang phase detector may include a first set of flip flops. It should be noted that, each of the first set of flip flops is configured to receive an input data sampled at each of a four phases of a Voltage Controlled Oscillator (VCO) clock. The half rate bang—bang phase detector may include a first set of logic gates. It should be noted that, each of the first set of logic gates is configured to generate a set of four exclusive—OR (XOR) outputs. In addition, the set of four XOR outputs is generated based on comparison of an output generated by each of two intermediate flip flops from the first set of flip flops. The half rate bang—bang phase detector may include a second set of flip flops. It should be noted that, the second set of flip flops is configured to generate a set of clean XOR outputs. In addition, the set of clean XOR outputs is generated based on re-sampling of each of the set of four XOR outputs. The half rate bang—bang phase detector may include a second set of logic gates. It should be noted that, each of the second set of logic gates is configured to generate a set of final outputs based on the set of clean XOR outputs.

In another embodiment, a method for capturing phase information during occurrence of data transition at Voltage Controlled Oscillator (VCO) is disclosed. The method may include receiving, by a first set of flip flops of a half rate bang—bang phase detector, an input data sampled at each of a four phases of a VCO clock. The method may include generating, by a first set of logic gates of the half rate bang—bang phase detector, a set of four exclusive—OR (XOR) outputs. It should be noted that, the set of four XOR outputs is generated based on comparison of an output generated by each of two intermediate flip flops from the first set of flip flops. The method may include generating, by a second set of flip flops of the half rate bang—bang phase detector, a set of clean XOR outputs. It should be noted that, the set of clean XOR outputs is generated based on re-sampling of each of the set of four XOR outputs. The method may include producing, by a second set of logic gates of the half rate bang—bang phase detector, a set of final outputs based on the set of clean XOR outputs.

It is to be understood that both the foregoing general description and the following detailed description are exemplary and explanatory only and are not restrictive of the invention, as claimed.

BRIEF DESCRIPTION OF THE DRAWINGS

The present application can be best understood by reference to the following description taken in conjunction with the accompanying drawing figures, in which like parts may be referred to by like numerals.

DETAILED DESCRIPTION OF THE DRAWINGS

The following description is presented to enable a person of ordinary skill in the art to make and use the invention and is provided in the context of particular applications and their requirements. Various modifications to the embodiments will be readily apparent to those skilled in the art, and the generic principles defined herein may be applied to other embodiments and applications without departing from the spirit and scope of the invention. Moreover, in the following description, numerous details are set forth for the purpose of explanation. However, one of ordinary skill in the art will realize that the invention might be practiced without the use of these specific details. In other instances, well-known structures and devices are shown in block diagram form in order not to obscure the description of the invention with unnecessary detail. Thus, the invention is not intended to be limited to the embodiments shown, but is to be accorded the widest scope consistent with the principles and features disclosed herein.

While the invention is described in terms of particular examples and illustrative figures, those of ordinary skill in the art will recognize that the invention is not limited to the examples or figures described. Those skilled in the art will recognize that the operations of the various embodiments may be implemented using hardware, software, firmware, or combinations thereof, as appropriate. For example, some processes can be carried out using processors or other digital circuitry under the control of software, firmware, or hard-wired logic. (The term "logic" herein refers to fixed hardware, programmable logic and/or an appropriate combination thereof, as would be recognized by one skilled in the art to carry out the recited functions.) Software and firmware can be stored on computer-readable storage media. Some other processes can be implemented using analog circuitry, as is well known to one of ordinary skill in the art. Additionally, memory or other storage, as well as communication components, may be employed in embodiments of the invention.

Figure 1:
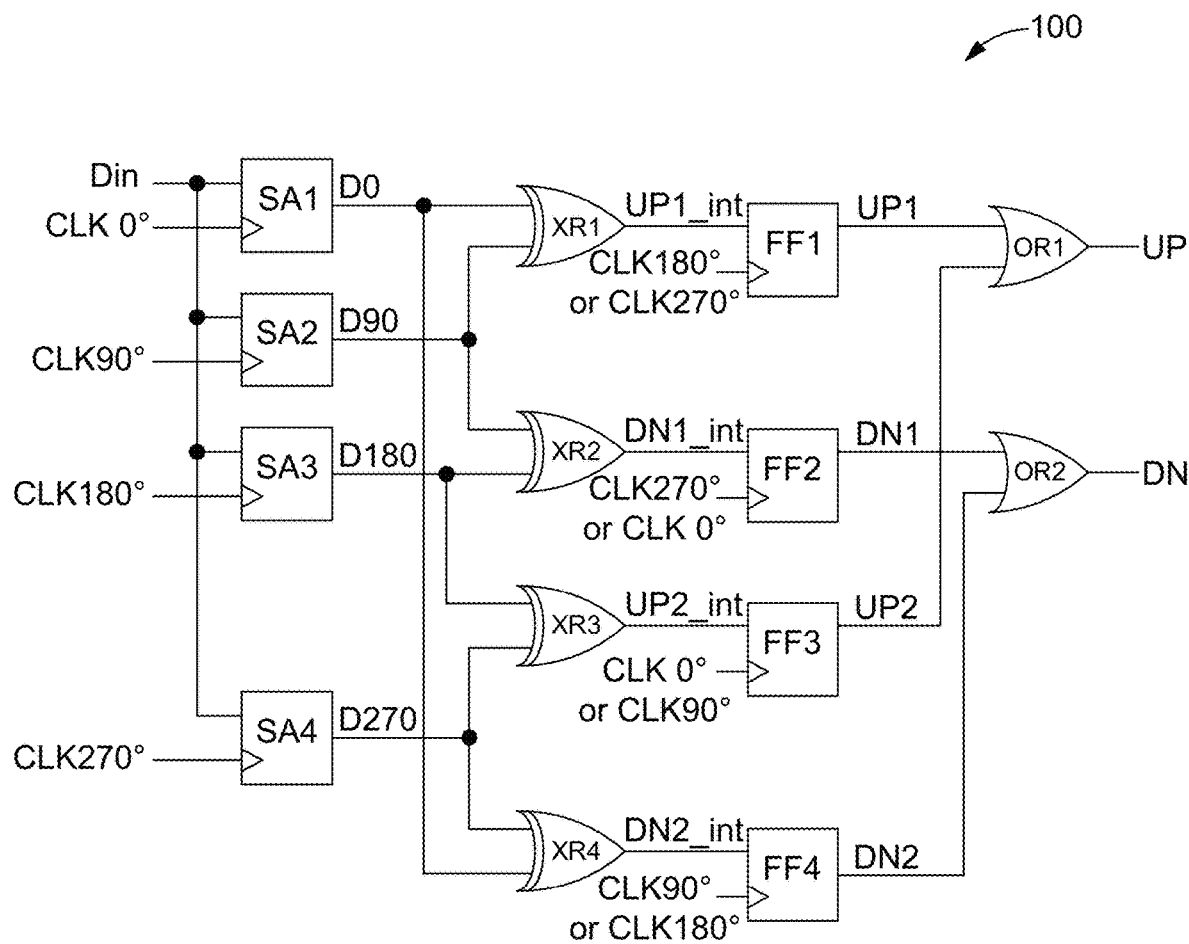
FIG. 1 illustrates a functional circuit diagram of a half rate bang—bang phase detector for high-speed Analog Clock and Data Recovery (CDR), in accordance with an embodiment.

A functional circuit diagram of a half rate bang—bang phase detector (BBPD) (100) for high-speed Analog Clock and Data Recovery (CDR), is illustrated in FIG. 1. The half rate BBPD (100) may include a first set of flip flops, a first set of logic gates, a second set of flip flops, and a second set of logic gates. In an embodiment, the first set of flip flops may include a first flip flop, a second flip flop, a third flip flop, and a fourth flip flop. Moreover, each of the first flip flop may correspond to a sense amplifier based flip flop. As represented in present FIG. 1, each of the first set of flip flops, i.e., the first flop, the second flip flop, the third flip flop, and the fourth flip flop may correspond to SA1, SA2, SA3, and SA4, respectively.

The first set of logic gates may include four exclusive—OR (XOR) gates (also referred as four XOR gates). In present FIG. 1, each of the first set of logic gates may be represented as XR1, XR2, XR3, and XR4. Further, the second set of flip flop may include four D flip-flops. As depicted in present FIG. 1, each of the second set of flip flops may correspond to FF1, FF2, FF3, and FF4. In addition, the second set of logic gates may include two OR gates, i.e., OR1, and OR2, as depicted in present FIG. 1. In an embodiment, each of the first set of flip flop may be configured to receive an input data sampled at each of a four phases of a Voltage Controlled Oscillator (VCO) clock. The input data sampled at each of the four phases of the VCO clock may be represented "Din" in current FIG. 1. The four phases of the VCO clock may include CLK0°, CLK90°, CLK180°, and CLK270°. Moreover, each of the four phases of the VCO clock are at a predetermined phase difference. In other words, each of the four phases of the VCO clock may be 90° phase apart. In an embodiment, CLK0° and CLK180° may be used to capture data, while CLK90° and CLK270° may be used to capture data transition. It should be noted that, the half rate BBPD (100) of the present invention is not limited to the usage of the four phases of the VCO clock. In some embodiment, the half rate BBPD (100) may be used for quarter rate operations by increasing number of VCO clock phases to eight. This in turn may require increment in number of the first set of flip flops, the first of logic gates, the second set of flip flops, and the second set of logic gates.

Upon receiving the input data, each of the first set of flip flops, i.e., SA1, SA2, SA3, and SA4 may be configured to generate an output. The output generated by each of the first set of flip flops may be depicted as D0, D90, D180, and D270. Further, the output D0, D90, D180, and D270 generated by each of the first set of flip flops may be fed as an input to each of the first set of logic gates for comparison. In an embodiment, the output generated by each of two intermediate flip flops from the first set of flip flops may be fed as the input for comparison in each of the first set of logic gates. By way of an example, the output D0 and D90 may fed as an input to first logic gate, i.e., XR1. The output D90 and D180 may be fed as an input to second logic gate, i.e., XR2. The output D180 and D270 may be fed as an input to third logic gate, i.e., XR3. And the output D270 and D0 may be fed as an input to fourth logic gate, i.e., XR4.

Upon receiving each of the two intermediate outputs, the first set of logic gates may be configured to generate a set of four XOR outputs. In an embodiment, the first set of logic gates may generate the set of four XOR outputs based on comparison of each of the two intermediate flip flops from the first set of flip flops. In an embodiment, each of the set of four XOR outputs generated may include UP1_int signal, DN1_int signal, UP2_int signal, and DN2_int signal. Further, each of the set of four XOR outputs may be associated with unwanted quarter pulses occurring periodically at every clock period. As depicted in present FIG. 1, each of the set of four XOR outputs, i.e., UP1_int signal, DN1_int signal, UP2_int signal, and DN2_int signal may correspond to UP1_int, DN1_int, UP2_int, and DN2_int respectively.

Once the set of four XOR outputs are generated, each of the set of four XOR outputs may be fed as an input in the second set of flip flops. By way of an example, each of the set of four XOR outputs, i.e., UP1_int, DN1_int, UP2_int, and DN2_int may be fed as the input to the second set of flip flops, i.e., FF1, FF2, FF3, and FF4 respectively. Upon receiving the set of four XOR outputs, the second set of flip flops may be configured to generate a set of clean XOR outputs. In an embodiment, each of the second set of flip flops may generate the set of clean XOR outputs by removing unwanted quarter pulses associated with each of the set of four XOR outputs, occurring periodically at every clock period.

In an embodiment, the set of clean XOR outputs may be generated based on re-sampling of each of the set of four XOR outputs. Moreover, re-sampling of each of the set of four XOR outputs by the second set of flip flops may be done by CLK180/CLK270, CLK270/Clk0, CLK0/Clk90, CLK90/Clk180 respectively. In an embodiment, the set of clean XOR outputs generated based on re-sampling of each of the set of four XOR outputs may include UP1 signal, DN1 signal, UP2 signal, and DN2 signal. As depicted in present FIG. 1, each of the set of clean XOR outputs, i.e., UP1 signal, DN1 signal, UP2 signal, and DN2 signal may correspond to UP1, DN1, UP2, and DN2 respectively.

Further, each of the set of clean XOR outputs, i.e., UP1 signal, DN1 signal, UP2 signal, and DN2 signal may be fed as an input to the second set of logic gates. In an embodiment, the second set of logic gates may include two OR gates. Upon receiving each of the set of clean XOR outputs as the input, the second set of logic gates may be configured to generate a set of final outputs based on the input received. The set of final outputs may be generated by combining two of the set of clean XOR outputs using one of the second set of logic gates. In addition, the set of final outputs may include a final UP signal and a final DN signal. By way of an example, the UP1 signal and UP2 signal may be combined using first OR gate, i.e., OR1 to generate the final UP signal (i.e., UP) as depicted by present FIG. 1. Similarly, DN1 signal and DN2 signal may be combined using second OR gate, i.e., OR2 to generate the final DN signal (i.e., DN) as depicted by present FIG. 1.

Once the set of final outputs, i.e., the final UP signal and the final DN signal are generated, then each of the set of final outputs are sent to a charge pump. In an embodiment, each of the set of final XOR outputs are sent to the charge pump in order to adjust frequency of the VCO. This in turn may adjust each of the four phases of the VCO clock.

Figure 2:
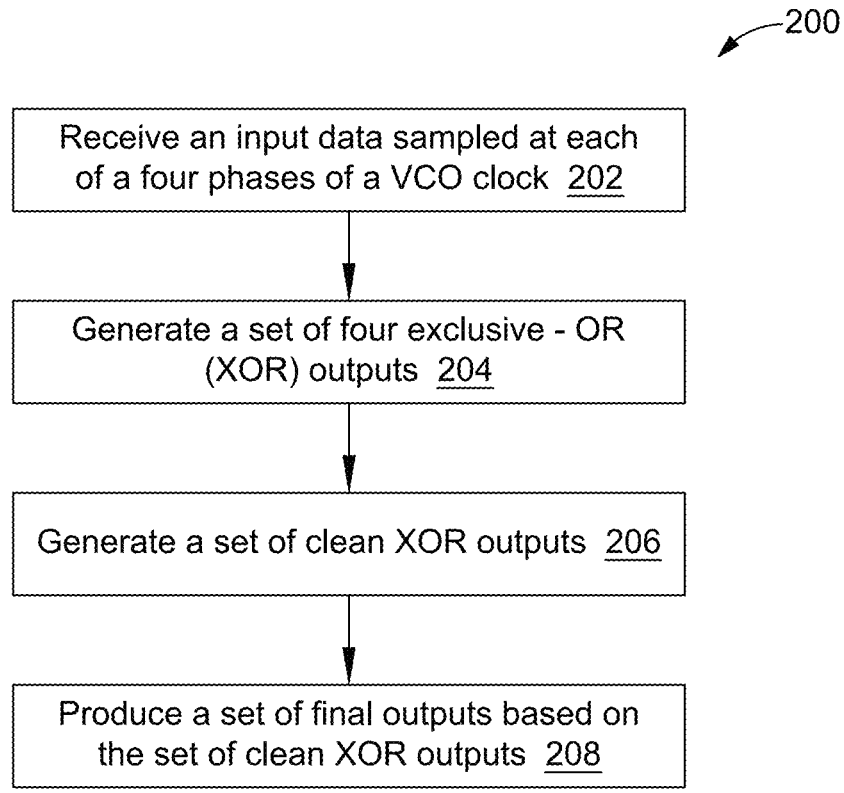
FIG. 2 illustrates a flowchart of a method for capturing phase information during occurrence of data transition at Voltage Controlled Oscillator (VCO), in accordance with an embodiment.

Referring now to FIG. 2, a flowchart of a method for capturing phase information during occurrence of data transition at Voltage Controlled Oscillator (VCO) is illustrated, in accordance with an embodiment. At step 202, an input data sampled at each of a four phases of a VCO clock may be received by a first set of flip flops. In an embodiment, the first set of flip flops may include a first flip flop, a second flip flop, a third flip flop, and a fourth flip flop. In addition, each of the first set of flip flops is a sense amplifier based flip flop. In conjunction to FIG. 1, the first set of flip flops may correspond to the first set of flip flops of the half rate BBPD (100). In other words, each of the first set of flip flops, i.e., the first flop, the second flip flop, the third flip flop, and the fourth flip flop may correspond to SA1, SA2, SA3, and SA4, respectively. In addition, the input data sampled at each of the four phases of the VCO clock may correspond to the input data "Din". In an embodiment, the four phases of the VCO clock may include CLK0°, CLK90°, CLK180°, and CLK270°. Moreover, each of the four phases of the VCO clock may be at a predetermined phase difference. For example, the predefined phase difference for each of the four phases of the VCO clock may be defined to be 90°.

Once the input data is received, an output may be generated corresponding to the input data sampled at each of the four phases of the VCO clock. The output may be generated by each of the first set of flip flops. In other words, upon receiving the input data, each of the first set of flip flops may generate the output for the input data sampled at each of the four phases of the VCO clock. In reference to FIG. 1, each of the first set of flip flops, i.e., SA1, SA2, SA3, and SA4 may generate output, i.e., D0, D90, D180, and D270 respectively.

At step 204, based on the output, i.e., D0, D90, D180, and D270, a set of four exclusive—OR (XOR) outputs may be generated. In an embodiment, the set of four XOR outputs may be generated by a first set of logic gates. The first set of logic gates may include four exclusive-OR (XOR) gates. In conjunction with FIG. 1, the first set of logic gates (i.e., four XOR gates) may correspond to XR1, XR2, XR3, and XR4. It should be noted that, each of the four XOR gates may correspond to a combinational circuit. Therefore, each of the four XOR gates may provide output for any change in received input. In an embodiment, the set of four XOR outputs may be generated by comparing the output generated by each of the two intermediate flip flops from the first set of flip flops. By way of an example, D0 may be compared (also referred as XORed) with D90. Similarly, D90 may be compared with D180. D180 may be compared with D270. Lastly, D270 may be compared with D0. The set of four XOR outputs generated by each of the first set of flip flops may include UP1_int signal, DN1_int signal, UP2_int signal, and DN2_int signal. In an embodiment, each of the set of four XOR outputs generated by the first set of flip flops may be associated with unwanted quarter pulses occurring periodically at every clock period of VCO clock. A method for generating the set of four XOR outputs has been explained in greater detail in conjunction to FIG. 3.

Once the set of four XOR outputs are generated, at step 206, a set of clean XOR outputs may be generated. In an embodiment, the set of clean XOR outputs may be generated based on re-sampling of each of the set of four XOR outputs. The set of clean XOR outputs may include UP1 signal, DN1 signal, UP2 signal, and DN2 signal. In an embodiment, the re-sampling of each of the set of four XOR outputs may be done using a second set of flip flops in order to generate the set of clean XOR outputs. The second set of flip flops may include four D flip flops. In reference to FIG. 1, each the second set of flip flops may correspond to FF1, FF2, FF3, and FF4 of the half rate BBPD (100). In an embodiment, the re-sampling of each of the set of four XOR outputs may be done in order to remove the unwanted quarter pulse occurring at every clock period to produce the set of clean XOR outputs. Moreover, the re-sampling of each of the set of four XOR outputs by the second set of flip flops may be done by CLK180°/CLK270°, CLK270°/CLK0°, CLK0°/CLK90°, CLK90°/CLK180° respectively.

By way of an example, in order to produce first clean XOR output (i.e., UP1 signal) from the set of clean XOR outputs, either of CLK180° or CLK270° is utilized based on Process Design Kit timing constraint. The CLK 180° or CLK 270° is utilized in order to minimize CDR loop delay and ensure reliable re-sampling of first of the set of four XOR outputs (i.e., UP1_int signal). In one embodiment, the CLK 180° may be utilized for re-sampling of the first XOR output (i.e., UP1_int signal) in order to generate the first clean XOR output (i.e., UP1 signal). In reference to FIG. 1, the CLK 180° may be utilized for re-sampling of the first of the set of four XOR outputs (i.e., UP1_int signal) when clock-to-Q delay of first of the first set of flip flops (i.e., SA1), transmission delay of first of the first set of logic gates (i.e., XR1), and setup time of first of the second set of flip flops (i.e., FF1) is less than 90° phase delay of each of the four phases of the VCO clock. It should be noted that, in clock-to Q delay of first of the first set of flip flops, 'Q' represents output of the first of the first set of flip flops, i.e., D0'. In another embodiment, CLK 270 may be utilized to re-sampling of the first of the set of four XOR outputs (i.e., UP1_int signal) for other slower technologies. The other slower technologies may correspond to technologies for which clock-to-Q delay of first of the first set of flip flops (i.e., SA1), transmission delay of first of the first set of logic gates (i.e., XR1), and setup time of first of the second set of flip flops (i.e., FF1) is greater than 90° phase delay of each of the four phases of the VCO clock. As will be appreciated, other clean XOR outputs, i.e., UP2 signal, DN1 signal, and DN2 signal of the set of clean XOR outputs may be generated using similar technique as used for generating UP1 signal.

Thereafter, at step 208, a set of final outputs may be produced based on the set of clean XOR outputs. The set of final outputs may be produced by combining two of the set of clean XOR outputs using one of a second set of logic gates. In an embodiment, the set of final outputs may include a final UP signal and a final DN signal. In addition, the second set of logic gates may include two OR gates. In reference to FIG. 1, two OR gates may correspond to the first OR gate, i.e., OR1 and second OR gate, i.e., OR2. By way of an example, the UP1 signal and the UP2 signal may be combined to produce the final UP signal. Moreover, the UP1 signal and the UP2 signal may be combined using the first OR gate (i.e., OR1) of the second set of logic gates. By way of another example, the DN1 signal and the DN2 signal may be combined to produce the final DN signal. Moreover, the DN1 signal and the DN2 signal may be combined using the second OR gate (i.e., OR2) of the second set of logic gates. Once the set of final output, i.e., final UP signal and the final DN signal are produced, the set of final outputs are sent to the charge pump. The charge pump may utilize each of the set of final output for adjusting frequency of VCO clock and thereby adjusting the four phases of the VCO clock. In other words, the final UP signal and the final DN signal may be used as an input for the charge pump. The charge pump may be configured to adjust each of the four phases of the VCO clock, CLK0°, CLK90°, CLK180°, and CLK270°. The charge pump may adjust each of the four phases of the VCO clock in order to match each of the four phases of the VCO clock with the input data, i.e., 'Din'.

Figure 3:
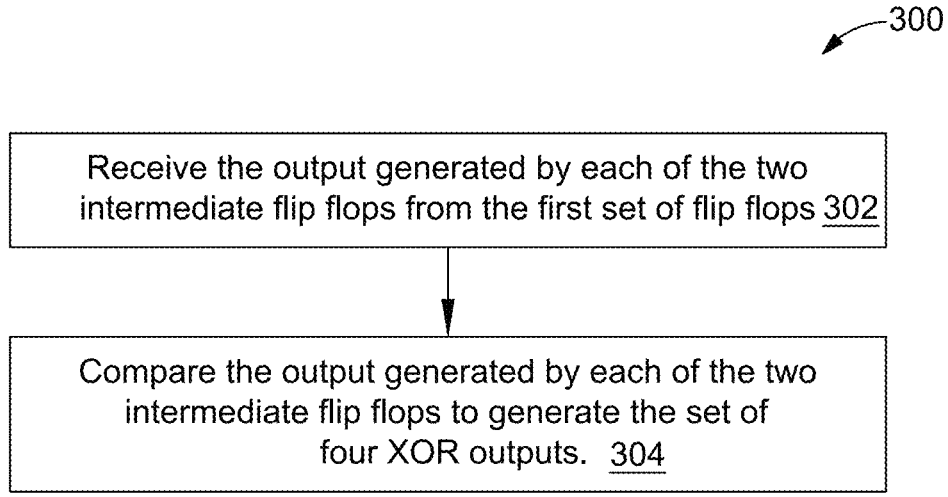
FIG. 3 illustrates a flowchart of a method for generating a set of four XOR outputs, in accordance with an embodiment.

Referring now to FIG. 3, a flowchart of a method for generating a set of four XOR outputs is illustrated, in accordance with an embodiment. At step 302, the output generated by each of the two intermediate flip flops from the first set of flip flops may be received. In an embodiment, the output generated by each of the two intermediate flip flops may be received by each of the first set of logic gates. In an embodiment, the first set of logic gates may include four XOR gates. In reference to FIG. 1, the first set of logic gates may correspond to XR1, XR2, XR3, and XR4. Further, each of the first set of flip flops may correspond to the first set of flip flops of half rate BBPD (100), i.e., SA1, SA2, SA3, and SA4. In addition, the output generated by each of the first set of flip flops, i.e., SA1, SA2, SA3, and SA4 may correspond to the output, i.e., D0, D90, D180, and D270 respectively.

By way of an example, output generated by each of the two intermediate flip flops, i.e., D0 and D90, D90 and D180, D180 and D270, and D270 and D0 may be fed as an input to each of the first set of logic gates, i.e., XR1, XR2, XR3, and XR4 respectively. Upon receiving the output of each of the two intermediate flip flops, at step 304, the output received of each of the two intermediate flip flops may be compared to generate the set of four XOR outputs. In an embodiment, the output of each of the two intermediate flip flops may be compared by each of the first set of logic gates, i.e., XR1, XR2, XR3, and XR4. By way of an example, D0 may be compared (also referred as XORed) with D90. Similarly, D90 may be compared with D180. D180 may be compared with D270. Lastly, D270 may be compared with D0. In an embodiment, the set of four XOR outputs generated based on comparison of the two intermediated flip flops from the first set of flip flops may include UP1_int signal, DN1_int signal, UP2_int signal, and DN2_int signal.

Figure 4:
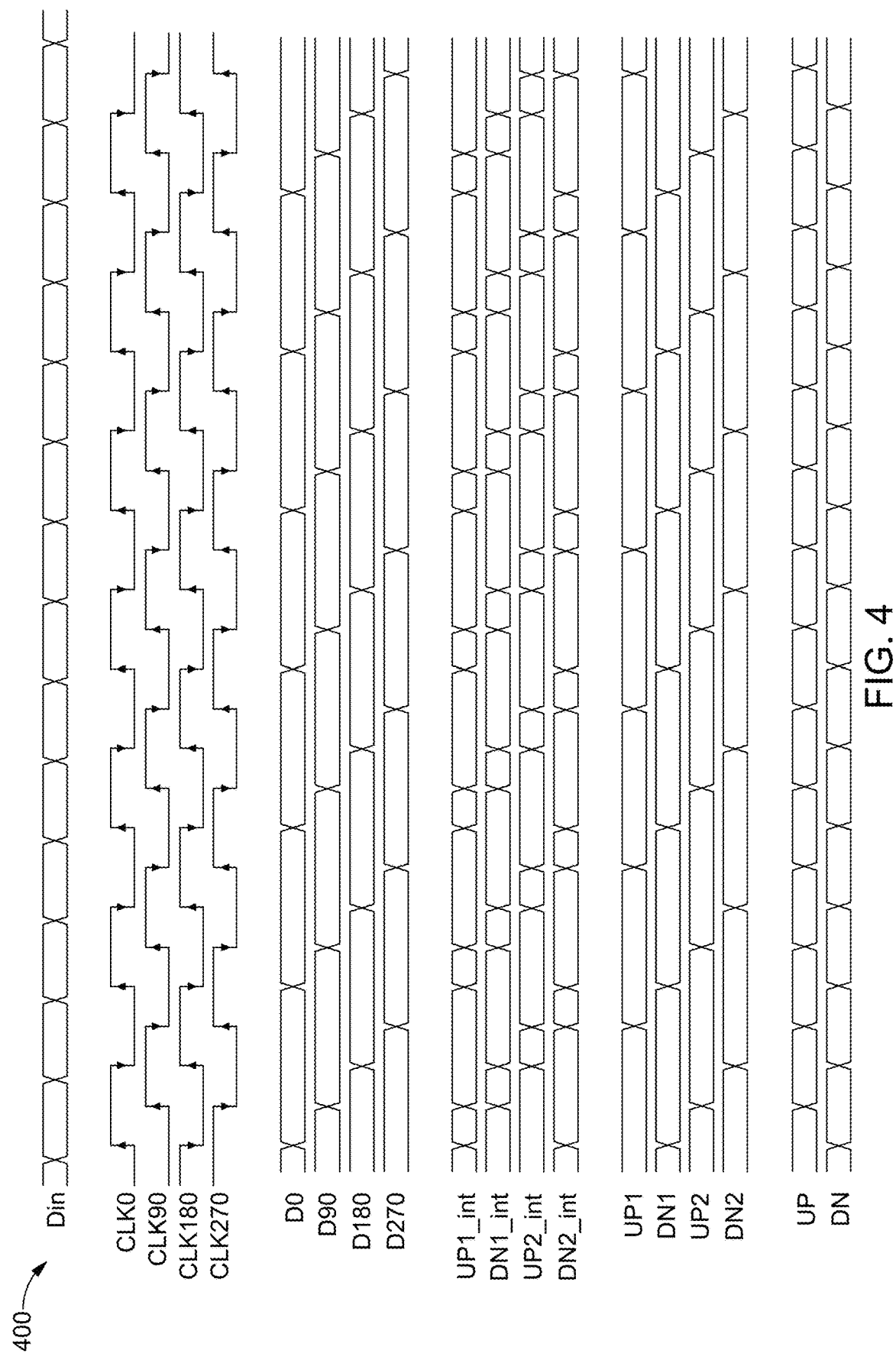
FIG. 4 represents various output signals generated by a half rate bang-bang phase detector when VCO clock is early, in accordance with an exemplary embodiment.

Referring now to FIG. 4, various output signals generated by a half rate bang-bang phase detector when VCO clock is early is represented, in accordance with an exemplary embodiment. As will be appreciated, FIG. 4 is explained in conjunction with FIG. 1. In reference to FIG. 1, the half rate bang-bang phase detector may correspond to the half rate BBPD (100). In an embodiment, each of the first set of flip flops may be configured to sample the input data, i.e., 'Din' during each of the four phases of the VCO clock. In other words, the first set of flips flops, i.e., SA1, SA2, SA3, and SA4 may sample the input data 'Din' during each of the four phases of the VCO clock, i.e., CLK0°, CLK90°, CLK180°, and CLK270°. In present FIG. 4, each of the four phases of the VCO clock, i.e., CLK0°, CLK90°, CLK180°, and CLK270° may be represented as CLK0, CLK90, CLK180, and CLK270. Moreover, each of the four phases of the VCO clock are at the predetermined phase difference.

As represented in present FIG. 4, first flip flop from the first set of flip flop (i.e., SA1) may sample the input data 'Din' at first rising edge of first phase of the VCO clock, i.e., CLK0°. Similarly, second flip flop from the first set of flip flop (i.e., SA2) may sample the input data 'Din' at first rising edge of second phase of the VCO clock, i.e., CLK90°.

Further, third flip flop from the first set of flip flop (i.e., SA3) may sample the input data 'Din' at first falling edge of third phase of the VCO clock, i.e., CLK180°. Similarly, fourth flip flop from the first set of flip flop (i.e., SA4) may sample the input data 'Din' at first falling edge of fourth phase of the VCO clock, i.e., CLK270°. As depicted, each of the four phases of the VCO clock may be aligned to center of the input data 'Din'.

Based on the input data 'Din' sampled at each of the four phases of the VCO clock, each of the first set of flip flops, i.e., SA1, SA2, SA3, and SA4 may generate output sampling signals (also referred as the output) D0, D90, D180, and D270 respectively. The output sampling signals, i.e., D0, D90, D180, and D270 generated may be represented as depicted in current FIG. 4. Once the output sampling signals are generated, each of the output sampling signals, i.e., D0, D90, D180, and D270 may be fed as the input for comparison in each of the first set of logic gates. In an embodiment, the first set of logic gates may include four exclusive-OR (XOR) gates. In conjunction to FIG. 1, the first set of logic gates may correspond to XR1, XR2, XR3, and XR4. Moreover, the output of each of two intermediate flip flops from the first set of flip flops may be fed as the input for comparison in each of the first set of logic gates.

As depicted, the first phase of VCO clock, i.e., CLK0° and the second phase of the VCO clock, i.e., CLK90° are not aligned, therefore a glitch may have been introduced during XOR operation. Each of the first set of logic gates may compare the output generated by each of the two intermediate flip flops from the first set of flip flops. Therefore, the glitch may have been introduced at each of the XOR output. By way of an example, the output D0 and D90 may fed as an input to first logic gate, i.e., XR1. The output D90 and D180 is fed as an input to second logic gate, i.e., XR2. The output D180 and 270 is fed as an input to third logic gate, i.e., XR3. And the output D270 and D0 is fed as an input to fourth logic gate, i.e., XR4. Based on comparison of the output of each of the two intermediate flip flops, the set of four XOR outputs may be generated. In present FIG. 4, signal of each of the set of four XOR outputs, i.e., UP1_int signal, DN1_int signal, UP2_int signal, and DN2_int signal may be represented as UP1_int, DN1_int, UP2_int, and DN2_int.

Further, each of the set of four XOR outputs may be re-sampled via the second set of flip flops. The second set of flip flops may be configured to generate the set of clean XOR outputs based re-sampling of each of the set of four XOR outputs. Further, the second set of flip flop may include four D flip-flops. In reference to FIG. 1, each of the second set of flip flop may correspond to FF1, FF2, FF3, and FF4. In present FIG. 4, the set of clean XOR outputs, i.e., UP1 signal, DN1 signal, UP2 signal, and DN2 signal generated based on re-sampling of each of the set of four XOR outputs may be represented in form of signals as UP1, DN1, UP2, and DN2 respectively. It should be noted that, the output of the first set of flip flops, the set of four XOR output, and the set of clean XOR outputs depicted in present FIG. 4 may be generated when at least one of the four phases of the VCO clock is early.

Further, each of the set of clean XOR outputs, UP1, DN1, UP2, and DN2 may be used to generate the set of final outputs. The set of final outputs may be generated by combining two of the set of clean XOR outputs using one of the second set of logic gates. The set of final outputs may include the final UP signal and the final DN signal. In reference to FIG. 1, the second set of logic gates may include two OR gates, i.e., OR1 and OR2. In an embodiment, two of the set of clean XOR outputs, i.e., UP1 and UP2 may be combine using OR1 to generate the final UP signal. In present FIG. 4, the final UP signal may be represented as UP. Similarly, DN1 and DN2 may be combined using OR2 to generate the final DN signal. In present FIG. 4, the final DN signal may be represented as DN. The final UP signal and the final DN signal generated may be send as the input to charge pump. The charge pump upon receiving the input may adjust the frequency of the VCO clock. The frequency of the VCO clock adjusted may adjust each of the four phases of the VCO clock. It should be noted that, in real scenarios, when the VCO clock is early, the half rate bang-bang phase detector may generate final DN signals only.

Figure 5:
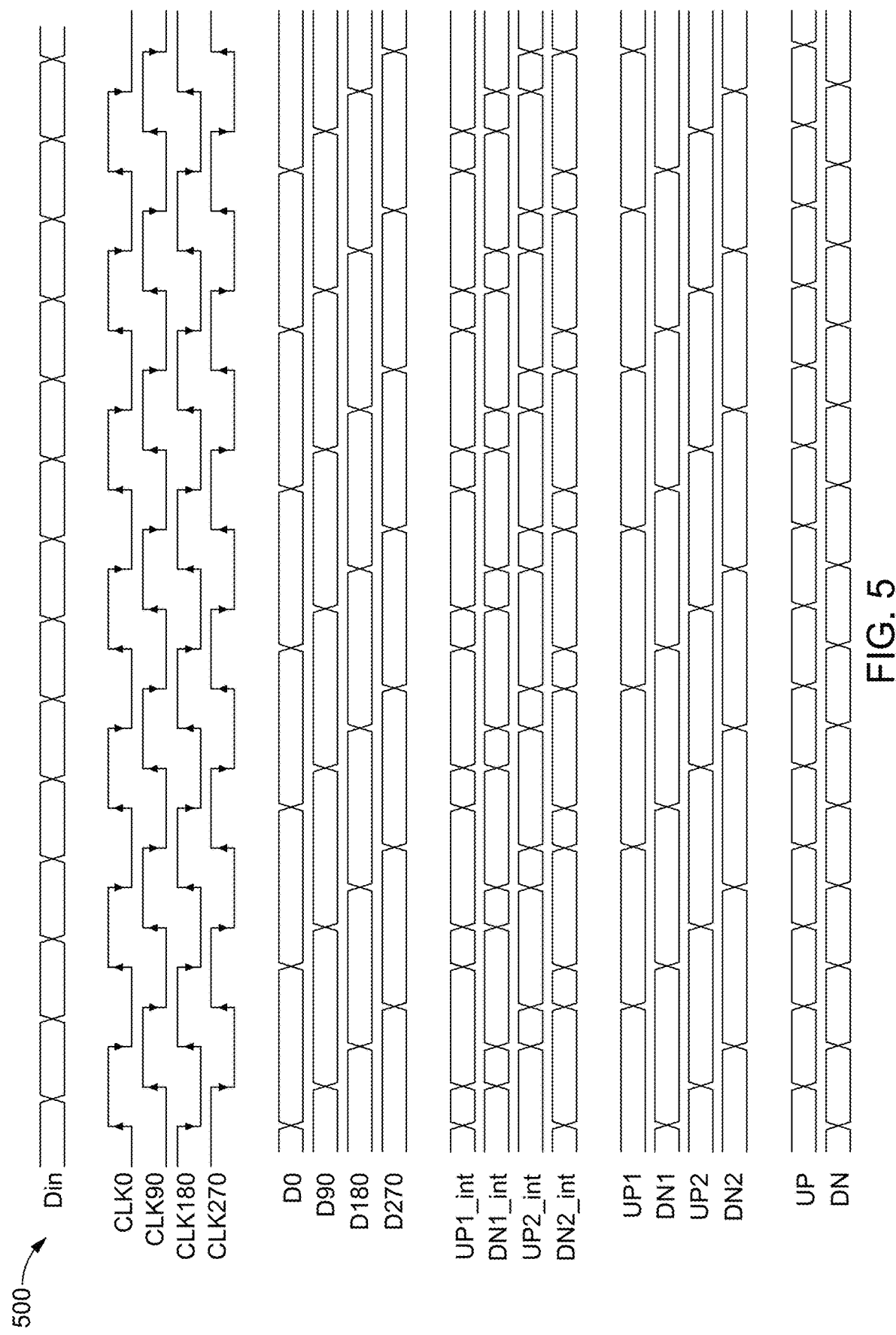
FIG. 5 represents various output signals generated by a half rate bang-bang phase detector when VCO clock is late, in accordance with another exemplary embodiment.

Referring now to FIG. 5, various output signals generated by a half rate bang-bang phase detector when VCO clock is late is represented, in accordance with an exemplary embodiment. As will be appreciated, FIG. 5 is explained in conjunction with FIG. 1. In reference to FIG. 1, the half rate bang-bang phase detector may correspond to the half rate BBPD (100). In an embodiment, each of the first set of flip flops may be configured to sample the input data, i.e., 'Din' during each of the four phases of the VCO clock. In other words, the first set of flips flops, i.e., SA1, SA2, SA3, and SA4 may sample the input data 'Din' during each of the four phases of the VCO clock, i.e., CLK0°, CLK90°, CLK180°, and CLK270°. In present FIG. 5, each of the four phases of the VCO clock, i.e., CLK0°, CLK90°, CLK180°, and CLK270° may be represented as CLK0, CLK90, CLK180, and CLK270. Moreover, each of the four phases of the VCO clock are at the predetermined phase difference.

As represented in present FIG. 5, first flip flop from the first set of flip flop (i.e., SA1) may sample the input data 'Din' at first rising edge of first phase of the VCO clock, i.e., CLK0°. Similarly, second flip flop from the first set of flip flop (i.e., SA2) may sample the input data 'Din' at first rising edge of second phase of the VCO clock, i.e., CLK90°. Further, third flip flop from the first set of flip flop (i.e., SA3) may sample the input data 'Din' at first rising edge of third phase of the VCO clock, i.e., CLK180°. Similarly, fourth flip flop from the first set of flip flop (i.e., SA4) may sample the input data 'Din' at first rising edge of fourth phase of the VCO clock, i.e., CLK270°. As depicted, each of the four phases of the VCO clock may be aligned to center of the input data 'Din'.

Based on the input data 'Din' sampled at each of the four phases of the VCO clock, each of the first set of flip flops, i.e., SA1, SA2, SA3, and SA4 may generate output sampling signals (also referred as the output) D0, D90, D180, and D270 respectively. The output sampling signals, i.e., D0, D90, D180, and D270 generated may be represented as depicted in current FIG. 5. Once the output sampling signals are generated, each of the output sampling signals, i.e., D0, D90, D180, and D270 may be fed as the input for comparison in each of the first set of logic gates. In an embodiment, the first set of logic gates may include four exclusive-OR (XOR) gates. In conjunction to FIG. 1, the first set of logic gates may correspond to XR1, XR2, XR3, and XR4. Moreover, the output of each of two intermediate flip flops from the first set of flip flops may be fed as the input for comparison in each of the first set of logic gates.

As depicted, the first phase of VCO clock, i.e., CLK0° and the second phase of the VCO clock, i.e., CLK90° are not aligned, therefore a glitch may have been introduced during XOR operation. Each of the first set of logic gates may compare the output generated by each of the two intermediate flip flops from the first set of flip flops. Therefore, the glitch may have been introduced at each of the XOR output.

By way of an example, the output D0 and D90 may fed as an input to first logic gate, i.e., XR1. The output D90 and D180 is fed as an input to second logic gate, i.e., XR2. The output D180 and 270 is fed as an input to third logic gate, i.e., XR3. And the output D270 and D0 is fed as an input to fourth logic gate, i.e., XR4. Based on comparison of the output of each of the two intermediate flip flops, the set of four XOR outputs may be generated. In present FIG. 5, signal of each of the set of four XOR outputs, i.e., UP1_int signal, DN1_int signal, UP2_int signal, and DN2_int signal may be represented as UP1_int, DN1_int, UP2_int, and DN2_int.

Further, each of the set of four XOR outputs may be re-sampled via the second set of flip flops. The second set of flip flops may be configured to generate the set of clean XOR outputs based re-sampling of each of the set of four XOR outputs. Further, the second set of flip flop may include four D flip-flops. In reference to FIG. 1, each of the second set of flip flop may correspond to FF1, FF2, FF3, and FF4. In present FIG. 5, the set of clean XOR outputs, i.e., UP1 signal, DN1 signal, UP2 signal, and DN2 signal generated based on re-sampling of each of the set of four XOR outputs may be represented in form of signals as UP1, DN1, UP2, and DN2 respectively. It should be noted that, the output of the first set of flip flops, the set of four XOR output, and the set of clean XOR outputs depicted in present FIG. 5 may be generated when at least one of the four phases of the VCO clock is late.

Further, each of the set of clean XOR outputs, UP1, DN1, UP2, and DN2 may be used to generate the set of final outputs. The set of final outputs may be generated by combining two of the set of clean XOR outputs using one of the second set of logic gates. The set of final outputs may include the final UP signal and the final DN signal. In reference to FIG. 1, the second set of logic gates may include two OR gates, i.e., OR1 and OR2. In an embodiment, two of the set of clean XOR outputs, i.e., UP1 and UP2 may be combine using OR1 to generate the final UP signal. In present FIG. 5, the final UP signal may be represented as UP. Similarly, DN1 and DN2 may be combined using OR2 to generate the final DN signal. In present FIG. 5, the final DN signal may be represented as DN. The final UP signal and the final DN signal generated may be send as the input to charge pump. The charge pump upon receiving the input may adjust the frequency of the VCO clock. The frequency of the VCO clock adjusted may adjust each of the four phases of the VCO clock. It should be noted that, in real scenarios, when the VCO clock is late, the half rate bang-bang phase detector may generate final UP signals only.

Various embodiments provide method and system for a half rate bang—bang phase detector for high-speed Analog Clock and Data Recovery (CDR). The half rate bang—bang phase detector may include a first set of flip flops. The first set of flip flops may be configured to receive an input data sampled at each of a four phases of a Voltage Controlled Oscillator (VCO) clock. The half rate bang—bang phase detector may further include a first set of logic gates. Each of the first set of logic gates may be configured to generate a set of four exclusive—OR (XOR) outputs. In addition, the set of four XOR outputs may be generated based on comparison of an output generated by each of two intermediate flip flops from the first set of flip flops. Further, the half rate bang—bang phase detector may include a second set of flip flops. The second set of flip flops may be configured to generate a set of clean XOR outputs. The set of clean XOR outputs may be generated based on re-sampling of each of the set of four XOR outputs. Additionally, the half rate bang—bang phase detector may include a second set of logic gates. Each of the second set of logic gates is configured to generate a set of final outputs based on the set of clean XOR outputs.

The system and method disclose a half rate bang-bang phase detector that may provide some advantages like, the disclosed half rate bang-bang phase detector may rectify all drawbacks of an existing 3 phase half rate bang-bang phase detector. In addition, the disclosed half rate bang-bang phase detector may be able to fetch phase information during occurrence of data transition at 270 degrees of VCO clock, thereby removing bit error caused in the existing 3 phase half rate bang-bang phase detector. Further, the disclosed half rate bang-bang phase detector enables CDR to track and detect error in input data with minimum data transition density, thereby increasing jitter tolerance. Additionally, the disclosed half rate bang-bang phase detector provides advantage over existing 4 phase half rate bang-bang phase detectors, as the disclosed half rate bang-bang phase detector uses CLK180/CLK270 for re-sampling of at least one of the set of four XOR outputs. This in turn reduces CDR loop delay and increases jitter tolerance. The half rate bang-bang phase detector also supports retiming of data at each of the four phases of the VCO clock in order to remove glitches.

It will be appreciated that, for clarity purposes, the above description has described embodiments of the invention with reference to different functional units and different combinations of logic gates. However, it will be apparent that any suitable distribution of functionality between different functional units and different combinations of logic gates may be used without detracting from the invention. For example, functionality illustrated to be performed by separate logic gates may be performed by the same logic gate. Hence, references to specific functional units are only to be seen as references to suitable means for providing the described functionality, rather than indicative of a strict logical or physical structure or organization.

Although the present invention has been described in connection with some embodiments, it is not intended to be limited to the specific form set forth herein. Rather, the scope of the present invention is limited only by the claims. Additionally, although a feature may appear to be described in connection with particular embodiments, one skilled in the art would recognize that various features of the described embodiments may be combined in accordance with the invention.

Furthermore, although individually listed, a plurality of means, elements or process steps may be implemented by, for example, a single unit or processor. Additionally, although individual features may be included in different claims, these may possibly be advantageously combined, and the inclusion in different claims does not imply that a combination of features is not feasible and/or advantageous. Also, the inclusion of a feature in one category of claims does not imply a limitation to this category, but rather the feature may be equally applicable to other claim categories, as appropriate.

What is claimed is:

1. A half rate bang-bang phase detector for high-speed Analog Clock and Data Recovery (CDR), the half rate bang-bang phase detector comprising:
    a first set of flip flops, wherein each of the first set of flip flops is configured to receive an input data sampled at each of a four phases of a Voltage Controlled Oscillator (VCO) clock;
    a first set of logic gates, wherein each of the first set of logic gates is configured to generate a set of four exclusive-OR (XOR) outputs, and wherein the set of four XOR outputs is generated based on comparison of an output generated by two adjacent intermediate flip flops from the first set of flip flops;
    a second set of flip flops, wherein the second set of flip flops is configured to generate a set of clean XOR outputs, and wherein the set of clean XOR outputs is generated based on re-sampling of each of the set of four XOR outputs, wherein the re-sampling XOR outputs by the second set of flip flops is done by CLK180/Clk270, CLK270/Clk0, CLK0/Clk90, CLK90/Clk180 respectively; and
    a second set of logic gates, wherein each of the second set of logic gates is configured to generate a set of final outputs based on the set of clean XOR outputs.

2. The half rate bang-bang phase detector of claim 1, wherein each of the first set of flip flops comprises a first flip flop, a second flip flop, a third flip flop, and a fourth flip flop, and wherein each of the first set of flip flops is a sense amplifier-based flip flop.

3. The half rate bang-bang phase detector of claim 1, wherein the four phases of the VCO clock comprises $CLK0^0$, $CLK90^0$, $CLK180^0$, and $CLK270^0$, and wherein each of the four phases of the VCO clock are at a predetermined phase difference.

4. The half rate bang-bang phase detector of claim 1, wherein the first set of logic gates comprises four exclusive-OR (XOR) gates, and wherein each of the four exclusive-OR (XOR) gates is configured to:
    receive the output generated by each of the two intermediate flip flops from the first set of flip flops; and
    compare the output generated by each of the two intermediate flip flops to generate the set of four XOR outputs.

5. The half rate bang-bang phase detector of claim 4, wherein the set of four XOR outputs comprises UP1_int signal, DN1_int signal, UP2_int signal, and DN2_int signal, and wherein each of the set of four XOR outputs are associated with unwanted quarter pulses occurring periodically at every clock period.

6. The half rate bang-bang phase detector of claim 1, wherein each of the second set of flip flops is a D flip-flop, and wherein the set of clean XOR outputs generated based on re-sampling of each of the set of four XOR outputs comprises UP1 signal, DN1 signal, UP2 signal, and DN2 signal.

7. The half rate bang-bang phase detector of claim 1, wherein the second set of logic gates comprises two OR gates in this case, and wherein the set of final outputs includes a final UP signal and a final DN signal.

8. The half rate bang-bang phase detector of claim 7, wherein each of the set of final outputs is generated by combining two of the set of clean XOR outputs using one of the second set of logic gates.

9. The half rate bang-bang phase detector of claim 8, wherein each of the set of final outputs generated is sent to a charge pump for adjusting frequency hence the four phases of the VCO clock.

10. A method for capturing phase information during occurrence of data transition at Voltage Controlled Oscillator (VCO), the method comprising:
    receiving, by a first set of flip flops of a half rate bang-bang phase detector, an input data sampled at each of a four phases of a VCO clock;
    generating, by a first set of logic gates of the half rate bang-bang phase detector, a set of four exclusive-OR (XOR) outputs, wherein the set of four XOR outputs is generated based on comparison of an output generated by two adjacent intermediate flip flops from the first set of flip flops;

generating, by a second set of flip flops of the half rate bang-bang phase detector, a set of clean XOR outputs, wherein the set of clean XOR outputs is generated based on re-sampling of each of the set of four XOR outputs, wherein the re-sampling XOR outputs by the second set of flip flops is done by CLK180/Clk270, CLK270/Clk0, CLK0/Clk90, CLK90/Clk180 respectively; and producing, by a second set of logic gates of the half rate bang-bang phase detector, a set of final outputs based on the set of clean XOR outputs.

11. The method of claim 10, wherein each of the first set of flip flops comprises a first flip flop, a second flip flop, a third flip flop, and a fourth flip flop, and wherein each of the first set of flip flops is a sense amplifier-based flip flop.

12. The method of claim 10, wherein the four phases of the VCO clock comprises CLK0°, CLK90°, CLK180°, and CLK270°, and wherein each of the four phases of the VCO clock are at a predetermined phase difference.

13. The method of claim 10, wherein the first set of logic gates comprises four exclusive-OR (XOR) gates, and wherein each of the four exclusive-OR (XOR) gates is configured to:

receive the output generated by each of the two intermediate flip flops from the first set of flip flops; and compare the output generated by each of the two intermediate flip flops to generate the set of four XOR outputs.

14. The method of claim 13, wherein the set of four XOR outputs comprises UP1_int signal, DN1_int signal, UP2_int signal, and DN2_int signal, and wherein each of the set of four XOR outputs are associated with unwanted quarter pulses occurring periodically at every clock period.

15. The method of claim 10, wherein each of the second set of flip flops is a D flip-flop, and wherein the set of clean XOR outputs generated based on re-sampling of each of the set of four XOR outputs comprises UP1 signal, DN1 signal, UP2 signal, and DN2 signal.

16. The method of claim 10, wherein the second set of logic gates comprises two OR gates in this case, and wherein the set of final outputs includes a final UP signal and a final DN signal.

17. The method of claim 16, wherein each of the set of final outputs is generated by combining two of the set of clean XOR outputs using one of the second set of logic gates.

18. The method of claim 17, wherein each of the set of final outputs generated is sent to a charge pump for adjusting frequency hence the four phases of the VCO clock.

* * * * *